United States Patent
Shiba et al.

(10) Patent No.: US 9,257,652 B2
(45) Date of Patent: Feb. 9, 2016

(54) PHOTOELECTRIC CONVERSION MATERIAL, METHOD FOR PRODUCING THE SAME, AND ORGANIC PHOTOVOLTAIC CELL CONTAINING THE SAME

(71) Applicant: HONDA MOTOR CO., LTD., Tokyo (JP)

(72) Inventors: Tadahiro Shiba, Wako (JP); Kazuhiro Miura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 516 days.

(21) Appl. No.: 13/778,440

(22) Filed: Feb. 27, 2013

(65) Prior Publication Data

US 2013/0228222 A1 Sep. 5, 2013

(30) Foreign Application Priority Data

| Mar. 5, 2012 | (JP) | ................. | 2012-048590 |
| Mar. 5, 2012 | (JP) | ................. | 2012-048592 |
| Dec. 20, 2012 | (JP) | ................. | 2012-278157 |
| Dec. 20, 2012 | (JP) | ................. | 2012-278168 |

(51) Int. Cl.
| H01L 51/00 | (2006.01) |
| C08G 61/10 | (2006.01) |
| H01L 51/42 | (2006.01) |
| B82Y 10/00 | (2011.01) |

(52) U.S. Cl.
CPC ............ *H01L 51/0035* (2013.01); *B82Y 10/00* (2013.01); *C08G 61/10* (2013.01); *H01L51/0045* (2013.01); *H01L 51/42* (2013.01); *C08G 2261/148* (2013.01); *C08G 2261/312* (2013.01); *C08G 2261/43* (2013.01); *C08G 2261/72* (2013.01); *C08G 2261/91* (2013.01); *H01L 51/4253* (2013.01); *Y02E 10/549* (2013.01)

(58) Field of Classification Search
CPC .................................................. C01B 31/0438
See application file for complete search history.

(56) References Cited

U.S. PATENT DOCUMENTS

| 8,012,530 B2 | 9/2011 | Yoshikawa et al. |
| 8,124,966 B2 | 2/2012 | Lazarev |
| 8,222,074 B2 | 7/2012 | Lazarev |
| 2014/0323668 A1* | 10/2014 | Burgoyne, Jr. ....... C08K 5/0025 525/471 |

FOREIGN PATENT DOCUMENTS

| JP | 2007-019086 A | 1/2007 |
| JP | 2007-273939 A | 10/2007 |
| JP | 4005571 B2 | 11/2007 |
| JP | 2009-231810 A | 10/2009 |
| JP | 2010-056492 A | 3/2010 |
| JP | 2010-508667 A | 3/2010 |
| JP | 2010-508677 A | 3/2010 |
| WO | 2008/056126 A1 | 5/2008 |
| WO | 2008-056126 A1 | 5/2008 |

OTHER PUBLICATIONS

Dias, Jerry Ray. A Theoretical Study of C60 Benzoids. Journal of Molecular Structure (Theochem) 1989, vol. 185, pp. 57-81.*
Wu et al. From Branched Polyphenylenes to Graphite Ribbons. Macromolecules 2003, vol. 36, pp. 7082-7089.*
Doyz et al. Synthesis of Large Polycyclic Aromatic Hydrocarbons: Variation of Size and Periphery. Journal of the American Chemical Society 2000, vol. 122, pp. 7707-7717.*
Office Action dated Jul. 7, 2015, issued in U.S. Appl. No. 13/778,661, U.S. Patent Office (6 pages).
Kuilla, T., et al., "Recent advances in graphene based polymer composites," Progress in Polymer Science, Jul. 27, 2010, pp. 1350-1375, vol. 35, Elsevier.
Office Action from the Japan Patent Office dated Dec. 1, 2015, issued in counterpart Japanese Patent Application No. 2012-278168 (3 pages).
Partial English Translation of Office Action from the Japan Patent Office dated Dec. 1, 2015, issued in counterpart Japanese Patent Application No. 2012-278168 (1 page).
Office Action from the Japan Patent Office dated Dec. 1, 2015, issued in counterpart Japanese Patent Application No. 2012-278157 (4 pages).
Partial English Translation of Office Action from the Japan Patent Office dated Dec. 1, 2015, issued in counterpart Japanese Patent Application No. 2012-278157 (1 page).
Wu, J., et al., "From Branched Polyphenylenses to Graphite Ribbons," Macromolecules, Aug. 19, 2003, vol. 36, pp. 7082-7089, American Chemical Society.

* cited by examiner

Primary Examiner — Jeffrey T Barton
Assistant Examiner — Meisha Binkley
(74) *Attorney, Agent, or Firm* — Capitol City TechLaw, PLLC; Samuel P. Burkholder

(57) ABSTRACT

A photoelectric conversion material, which acts as an electron donor for donating an electron or an electron acceptor for accepting an electron, contains a polymer having at least one structural unit selected from graphenes represented by the following general formulae (1) to (4):

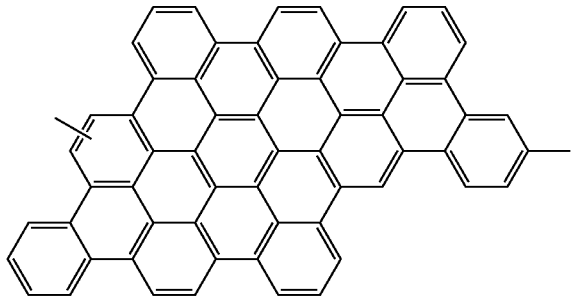

(1)

(2)

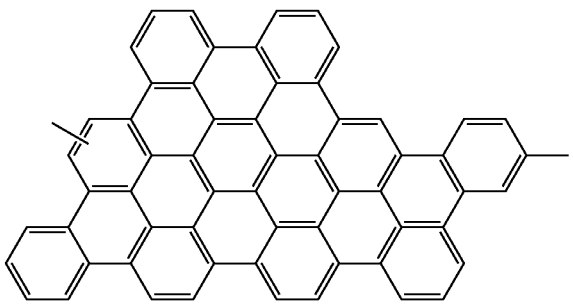

-continued (3)

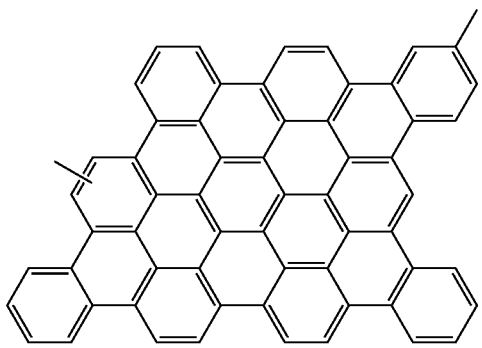

(4)

12 Claims, 8 Drawing Sheets

FIG. 4

| PROPERTY | EVALUATION | NANOGRAPHENE POLYMER | P3HT |
|---|---|---|---|
| Eg | ULTRAVIOLET-VISIBLE ABSORPTION SPECTROSCOPY (UV-Vis) | 2.0eV | 2.2eV |
| HOMO | PHOTOELECTRON YIELD SPECTROSCOPY (PYS) | -5.9eV | -4.7eV |

PHOTOELECTRIC CONVERSION MATERIAL, METHOD FOR PRODUCING THE SAME, AND ORGANIC PHOTOVOLTAIC CELL CONTAINING THE SAME

CROSS-REFERENCE TO RELATED APPLICATIONS

This application is based upon and claims the benefit of priority from Japanese Patent Applications No. 2012-048590 filed on Mar. 5, 2012, No. 2012-048592 filed on Mar. 5, 2012, No. 2012-278157 filed on Dec. 20, 2012 and No. 2012-278168 filed on Dec. 20, 2012, the contents all of which are incorporated herein by reference.

BACKGROUND OF THE INVENTION

1. Field of the Invention

The present invention relates to a photoelectric conversion material containing a polymer having a condensed aromatic ring structural unit, a method for producing the photoelectric conversion material, and an organic photovoltaic cell using the photoelectric conversion material.

2. Description of the Related Art

Organic photovoltaic cells using organic materials, which can be easily produced by a low-cost process such as a roll-to-roll process, have attracted much attention. Such organic photovoltaic cells include bulk heterojunction-type organic photovoltaic cells (hereinafter referred to also as BHJ solar cells).

The BHJ solar cell has a photoelectric conversion layer for converting a light into electricity, and the photoelectric conversion layer contains a mixture of a donor domain and an acceptor domain. The donor domain contains a photoelectric conversion material that acts as an electron donor, and the acceptor domain contains a photoelectric conversion material that acts as an electron acceptor. Specifically, the photoelectric conversion layer is interposed between positive and negative electrodes. When sunlight is introduced through the positive electrode into the photoelectric conversion layer, an exciton is generated in the layer.

The exciton reaches an interface between the donor and acceptor domains, and then is divided into an electron and a hole. The electron is transferred through the acceptor domain to the negative electrode, while the hole is transferred through the donor domain to the positive electrode. The hole and the electron are utilized to generate an electrical energy for biasing an external circuit electrically connected to the negative and positive electrodes.

As described in Japanese Laid-Open Patent Publication No. 2007-273939, typical examples of the photoelectric conversion materials (i.e. the donor and the acceptor) used in the photoelectric conversion layer having the above function include poly(3-hexylthiophene) (P3HT, see FIG. 6) and phenyl-$C_{61}$-butyric acid methyl ester (PCBM, see FIG. 7) respectively.

P3HT and PCBM have energy levels of highest occupied molecular orbitals (HOMOs) and lowest unoccupied molecular orbitals (LUMOs) shown in FIG. 8. When the light is introduced into the photoelectric conversion layer as described above, an electron is transferred from the HOMO to the LUMO in the donor P3HT. Thus, the energy level difference between the HOMO and the LUMO of P3HT corresponds to the bandgap (Eg).

Then, the electron in the LUMO of P3HT is transferred to the LUMO of the acceptor PCBM, whereby the electron and the hole are generated. Thus, the energy level difference between the LUMO of P3HT and the LUMO of PCBM results in an energy loss, and the energy level difference between the HOMO of P3HT and the LUMO of PCBM corresponds to the open circuit voltage (Voc).

As the photoelectric power conversion efficiency of the solar cell becomes higher, the area required for achieving a desired power generation capacity is reduced. Therefore, advantageously, the solar cell can have a lighter weight and a smaller installation area, so that the layout of the solar cell can be freely designed.

The photoelectric power conversion efficiency of the organic photovoltaic cells such as the BHJ solar cell can be increased by (a) improving the absorption of a light to accelerate the exciton generation, (b) improving the absorption of a long-wavelength (near-infrared) light to increase the sunlight utilization efficiency, (c) increasing the open circuit voltage Voc, or the like. In view of achieving the procedures of (a) to (c), a donor having (A) a high absorbance coefficient, (B) a small energy level difference between the HOMO and LUMO (a narrow bandgap Eg), and (C) a LUMO energy level close to that of the acceptor may be selected.

Condensed aromatic ring compounds (i.e. π-electron conjugated compounds) described in Japanese Patent No. 4005571 and Japanese Laid-Open Patent Publication Nos. 2010-056492, 2007-019086, and 2010-508677 (PCT) may have the above properties of (A) to (C). Such condensed aromatic ring compounds are sometimes referred to as graphenes (see Japanese Laid-Open Patent Publication No. 2007-019086).

SUMMARY OF THE INVENTION

In a technology described in Japanese Patent No. 4005571, a functional group is bonded to hexabenzocoronene (HBC), and the resultant molecules are self-assembled utilizing the functional group to obtain a so-called nanotube-like aggregate. Thus, a large number of processes are required to obtain the final semiconductor product. In addition, it is unclear whether the obtained aggregate is a p-type (donor) or an n-type (acceptor).

In Japanese Laid-Open Patent Publication No. 2010-056492, it is suggested that a nanotube composed of an HBC aggregate has both of a hole-conducting path and an electron-conducting path. In a technology described in Japanese Laid-Open Patent Publication No. 2010-056492, the inner and outer surfaces of the nanotube are covered with a fullerene, and the coverage is selected to control the hole mobility in HBC. It is clear from this that the electron-donating property of HBC per se cannot be improved in the technologies of Japanese Patent No. 4005571 and Japanese Laid-Open Patent Publication No. 2010-056492.

In a technology described in Japanese Laid-Open Patent Publication No. 2007-019086, a functional group having a fluorine atom is bonded to a graphene derivative to obtain an n-type semiconductor. Thus, in this technology, a donor cannot be produced though the acceptor is obtained.

All of Japanese Patent No. 4005571 and Japanese Laid-Open Patent Publication Nos. 2010-056492, 2007-019086, and 2010-508677 (PCT) disclose only organic low-molecular compounds. As is well known, such organic low-molecular compounds are poorly soluble in a solvent. Therefore, disadvantageously, it is difficult to form the photoelectric conversion layer containing the compound by using the roll-to-roll process or the like.

A principal object of the present invention is to provide a photoelectric conversion material, which has an excellent property as an electron donor or acceptor and can be simply used with ease in a photoelectric conversion layer.

Another object of the invention is to provide a method for producing the photoelectric conversion material.

A further object of the invention is to provide an organic photovoltaic cell having the photoelectric conversion layer containing the photoelectric conversion material.

According to an aspect of the invention, there is provided a photoelectric conversion material that acts as an electron donor for donating an electron or an electron acceptor for accepting an electron. The photoelectric conversion material contains a polymer having at least one structural unit selected from graphenes represented by the following general formulae (1) to (4).

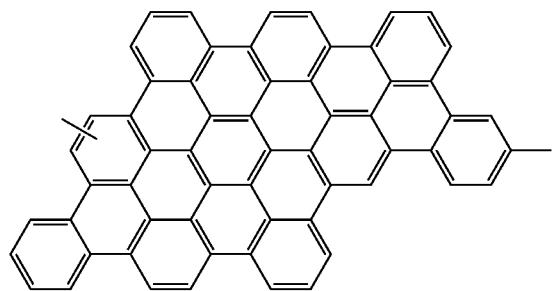

(1)

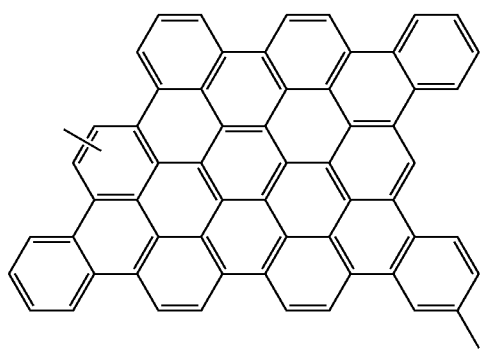

(2)

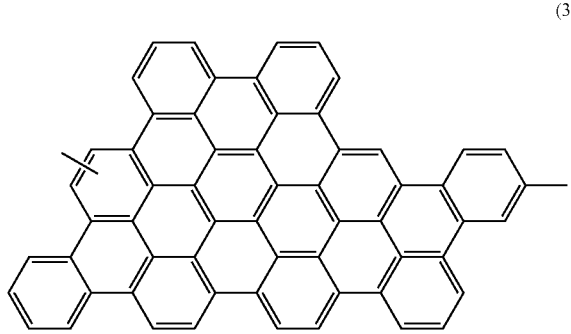

(3)

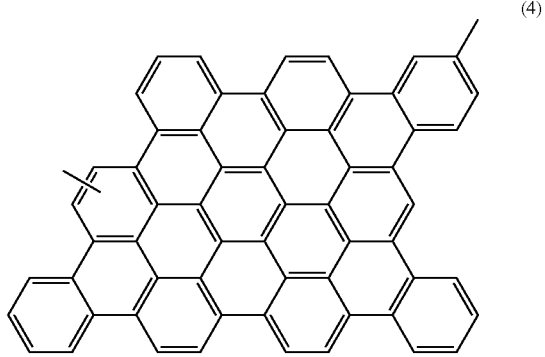

(4)

The photoelectric conversion material of the invention contains the π-conjugated polymer having the condensed aromatic ring structural unit. A π-electron cloud is spread over the π-conjugated polymer. The π-conjugated polymer is hereinafter referred to also as the nanographene polymer. This polymer can have a high absorbance coefficient and actively generate an exciton because the π-electron cloud spreads along the main chain.

In particular, the polymer exhibits a small energy level difference between the HOMO and the LUMO, and thus has a narrow bandgap Eg. Therefore, the polymer has a maximum absorption wavelength shifted to the long-wavelength side, and thereby can excellently absorb a long-wavelength (near-infrared) light. Consequently, the polymer exhibits an improved sunlight utilization efficiency.

Furthermore, the polymer has a LUMO energy level lower (deeper) than those of P3HT and the like. Therefore, a photoelectric conversion layer using the polymer as a donor in combination with the acceptor PCBM exhibits an energy loss lower than that of a layer using the donor P3HT. Consequently, organic photovoltaic cells using the polymer exhibit a high open circuit voltage Voc.

For the above reasons, the organic photovoltaic cells containing the polymer as the donor have an improved power conversion efficiency.

Incidentally, in the present invention, the condensed aromatic rings represented by the general formulae (1) to (4) are referred to as graphenes as in Japanese Laid-Open Patent Publication No. 2007-019086. Nanometer-scale graphene structural units are referred to as nanographenes.

For example, the polymer may be a reaction product derived from a polyphenylene represented by the following general formula (5).

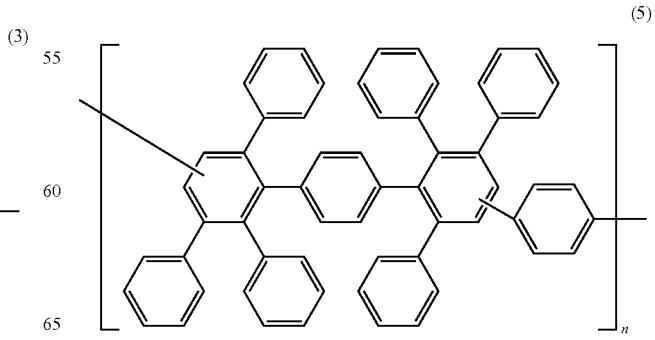

(5)

The π-conjugated polymer having the condensed aromatic rings, which the π-electron cloud is sufficiently spread over, can be suitably produced by a reaction of the polyphenylene.

The polymer preferably has a polymerization degree (the number of the structural units) of 10 to 150. When the polymerization degree is less than 10, it is not easy to sufficiently increase the absorbance coefficient or to sufficiently lower the Eg. On the other hand, when the polymerization degree is more than 150, it takes a long time to perform the polymerization, resulting in a low polymer production efficiency.

In other words, when the polymerization degree is within the above range, the polymer can be efficiently produced with an excellent donor property.

In the case of using the above graphene as the structural unit, the polymer preferably has a molecular weight of 7,400 to 111,500.

According to another aspect of the invention, there is provided a method for producing a photoelectric conversion material that acts as an electron donor for donating an electron or an electron acceptor for accepting an electron. The method contains polymerizing a phenylene derivative to prepare a polyphenylene represented by the following general formula (5) and reacting the polyphenylene to prepare a polymer having at least one structural unit selected from graphenes represented by the following general formulae (1) to (4).

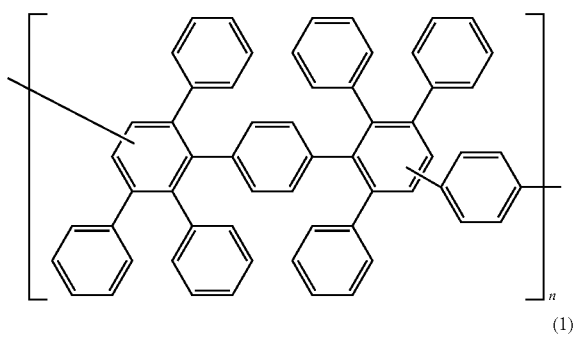

(5)

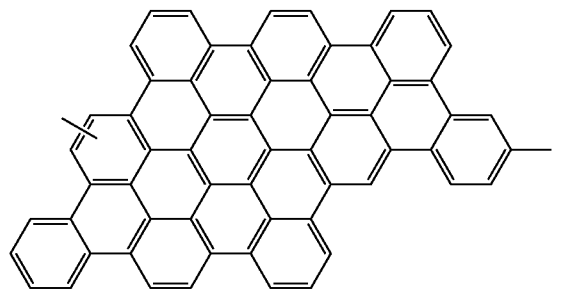

(1)

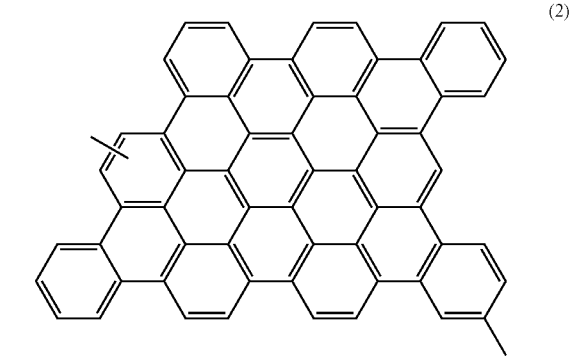

(2)

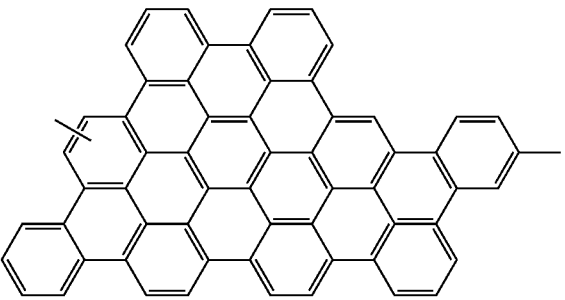

(3)

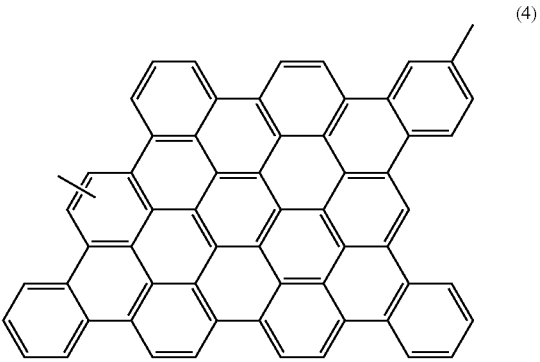

(4)

The method is capable of readily producing the polymer as the photoelectric conversion material (the donor or the acceptor). Thus, the polymer having the graphene structural unit can be produced by the steps of polymerizing a phenylene derivative and subjecting the obtained polyphenylene to a further reaction.

In the polymerization, it is preferred that the polymerization degree of the polymer is controlled within a range of 10 to 150 for the above reasons. For example, the polymerization degree of 10 to 150 can be achieved by appropriately selecting the reaction temperature, the reaction time, or another condition in the polymerization.

According to a further aspect of the invention, there is provided an organic photovoltaic cell using the above-described photoelectric conversion material containing the polymer. The organic photovoltaic cell has a photoelectric conversion layer containing the photoelectric conversion material as the electron donor.

In the organic photovoltaic cell using the donor of the photoelectric conversion material in combination with the acceptor PCBM, the photoelectric conversion layer exhibits a higher absorbance coefficient, and the donor exhibits a smaller energy level difference between the HOMO and LUMO (a narrow bandgap Eg), as compared with a cell using P3HT. Furthermore, the donor has a LUMO energy level close to that of the acceptor PCBM.

Therefore, the organic photovoltaic cell exhibits an active exciton generation property, an improved sunlight utilization efficiency, and a high open circuit voltage Voc. For these reasons, the organic photovoltaic cell has an improved power conversion efficiency.

Since the organic photovoltaic cell has a high power conversion efficiency, only a small area is required for achieving a desired power generation capacity. Therefore, the organic photovoltaic cell can have a light weight and a small load on its installation site. Furthermore, the organic photovoltaic cell can be placed in a small site, so that the layout of the solar cell can be freely designed.

For example, the organic photovoltaic cell is preferably a bulk heterojunction-type solar cell having a photoelectric conversion layer containing a mixture of a donor domain and an acceptor domain. The bulk heterojunction-type solar cell has a larger contact area between the donor and acceptor domains, as compared with a planar heterojunction-type solar cell having a donor layer and an acceptor layer separated from each other. In the organic photovoltaic cell, the exciton is divided into the electron and hole for power generation mainly on the interface between the donor and acceptor domains. Therefore, the bulk heterojunction-type solar cell exhibits a higher power conversion efficiency due to the larger contact area.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 4 is a table including properties of P3HT and the photoelectric conversion material (nanographene polymer) of the embodiment;

DESCRIPTION OF THE PREFERRED EMBODIMENTS

A preferred embodiment of the photoelectric conversion material and the production method of the present invention will be described in detail below using a BHJ solar cell having a photoelectric conversion layer containing the material with reference to the accompanying drawings.

Figure 1:
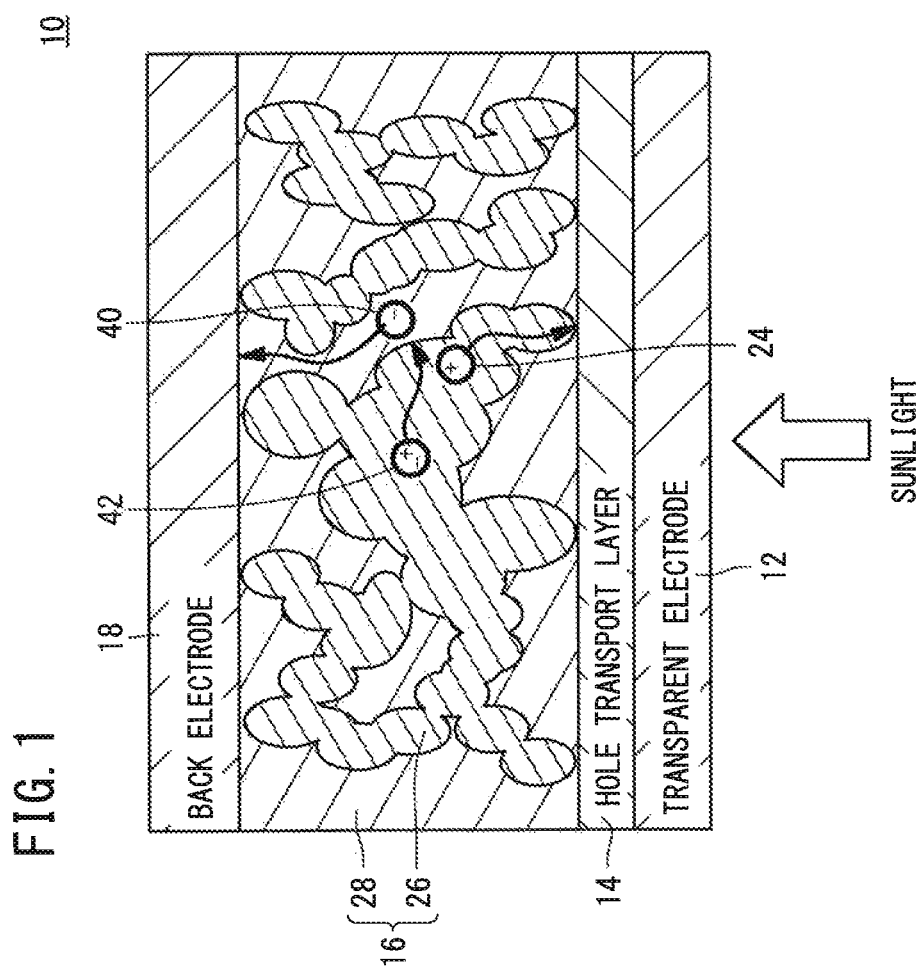
FIG. 1 is a schematic longitudinal cross-sectional view of a bulk heterojunction-type organic photovoltaic cell according to an embodiment of the present invention.

FIG. 1 is a schematic longitudinal cross-sectional view of a principal part in a BHJ solar cell 10 according to this embodiment. In the BHJ solar cell 10, a hole transport layer 14, a photoelectric conversion layer 16, and a back electrode 18 are stacked in this order on a transparent electrode 12.

The transparent electrode 12 acts as a positive electrode. Thus, holes 24 are transferred to the transparent electrode 12. The transparent electrode 12 may be composed of a material having a sufficient transmittance of a light such as sunlight, and examples of such materials include indium-tin composite oxide (ITO).

The hole transport layer 14 acts to accelerate the transfer of the holes 24 from the photoelectric conversion layer 16 to the transparent electrode 12. In general, the hole transport layer 14 contains a poly(3,4-ethylenedioxythiophene) doped with a polystyrene sulfonic acid, i.e. a so-called PEDOT:PSS.

The photoelectric conversion layer 16 contains a combination of a donor domain 26 and an acceptor domain 28. The donor domain 26 contains a photoelectric conversion material that acts as an electron donor, and the acceptor domain 28 contains a photoelectric conversion material that acts as an electron acceptor. Preferred examples of the acceptor materials include PCBM.

The donor is a p-type semiconductor composed of a photoelectric conversion material according to the embodiment of the invention. The photoelectric conversion material of this embodiment contains a polymer having a structural unit selected from graphenes represented by the following general formulae (1) to (4).

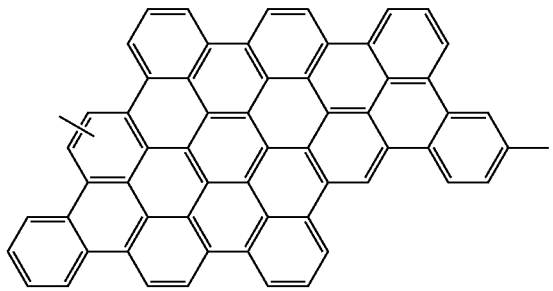

(1)

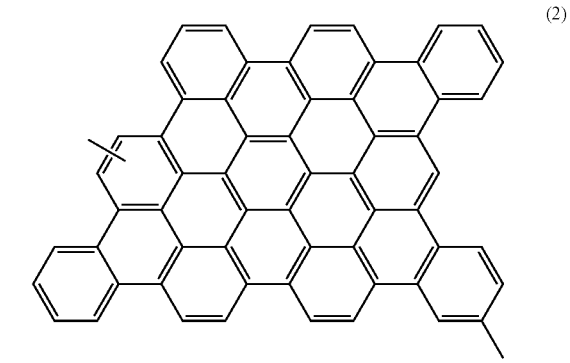

(2)

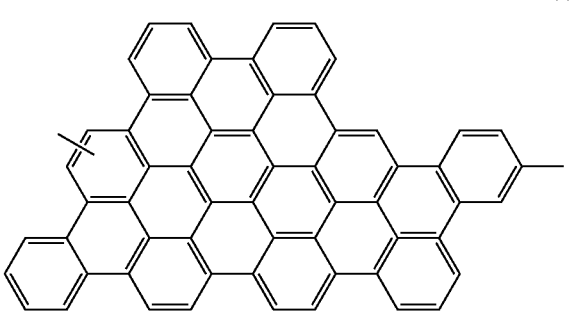

(3)

(4)

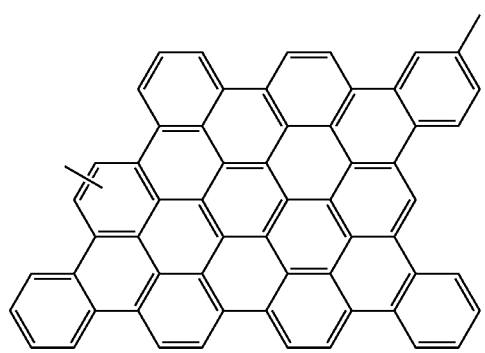

Figure 2:
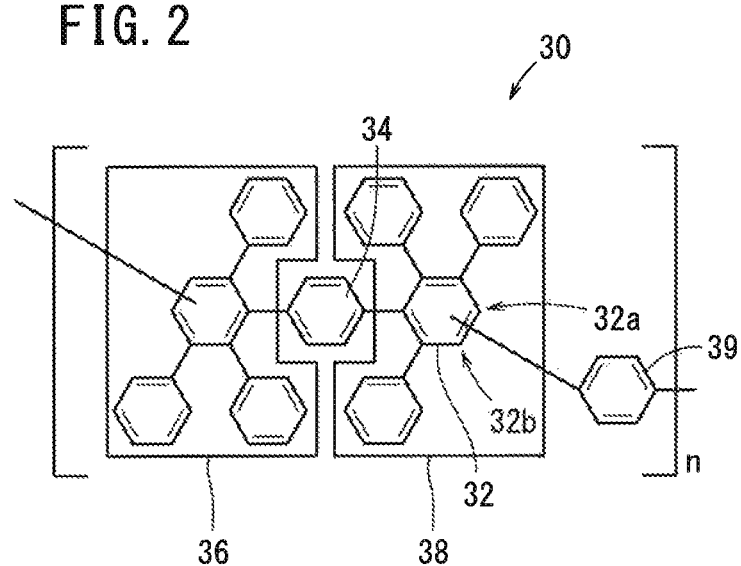
FIG. 2 is an explanatory view of the structural unit in a polyphenylene.

For example, the polymer may be a reaction product derived from a polyphenylene represented by the following general formula (5) and FIG. 2.

(5)

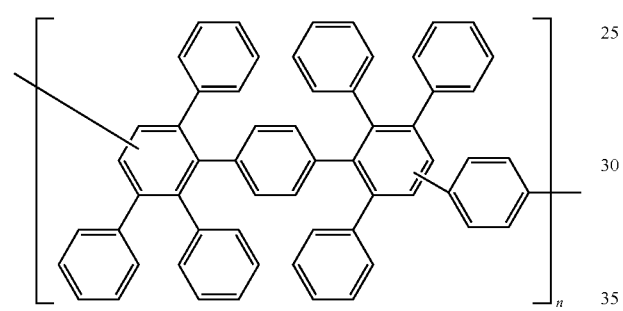

As shown in FIG. 2, in a structural unit 30 of the polyphenylene, a benzene ring 39 may be bonded to any one of positions 32a and 32b in a benzene ring 32. Thus, the structural unit 30 may be selected from structural isomers.

The structural unit 30 has such a structure that triphenylbenzene skeletons 36 and 38 are singly-bonded to a center benzene ring 34. The triphenylbenzene skeletons 36 and 38 can be rotated about the single bonds to the benzene ring 34, and the conformation of the structural unit 30 can be changed depending on the rotations.

Specifically, the structural unit 30 can have the following structures U1 to U4. Consequently, the polyphenylene contains at least one of the structures.

U1

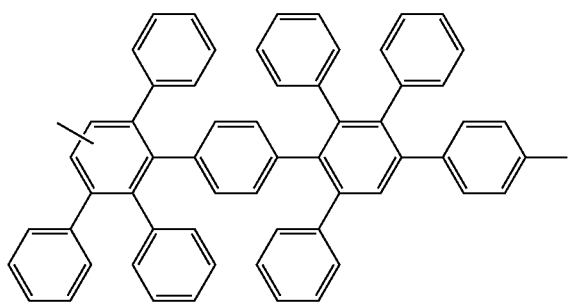

U2

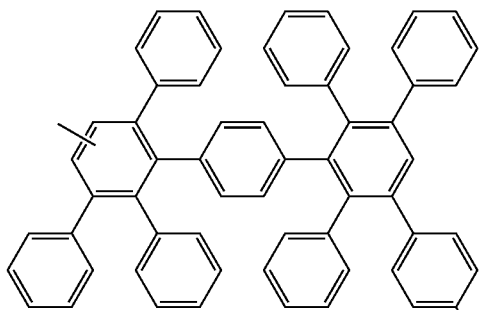

U3

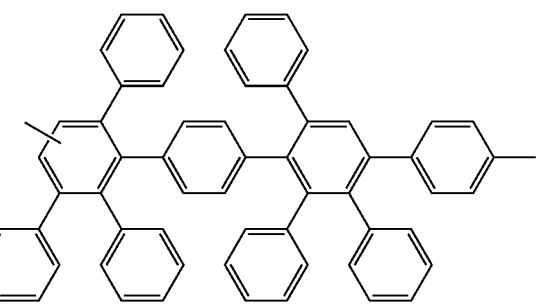

U4

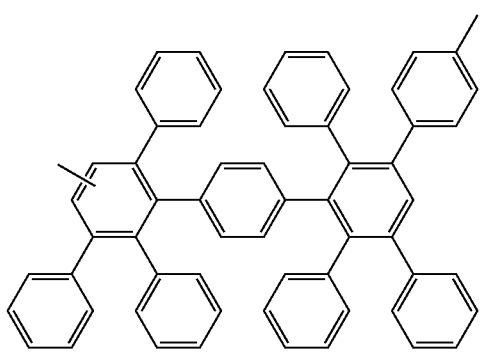

The photoelectric conversion material of this embodiment is the polymer derived from the polyphenylene having the above structure as the structural unit 30. Therefore, the structural unit (repeating unit) of the polymer depends on the structures U1 to U4 in the unreacted polyphenylene. When the structures U1 to U4 are reacted, the nanographenes represented by the following general formulae (1) to (4) are formed respectively as the structural unit of the polymer.

(1)

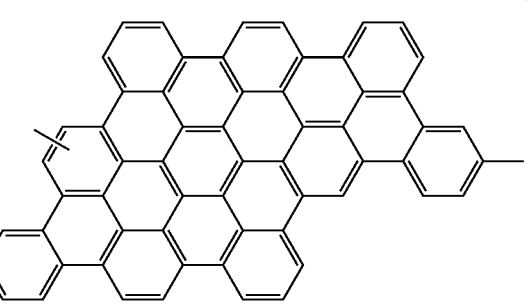

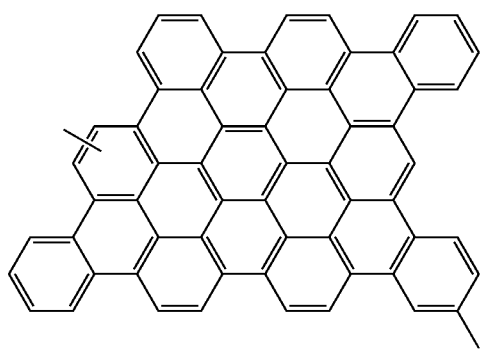

(2)

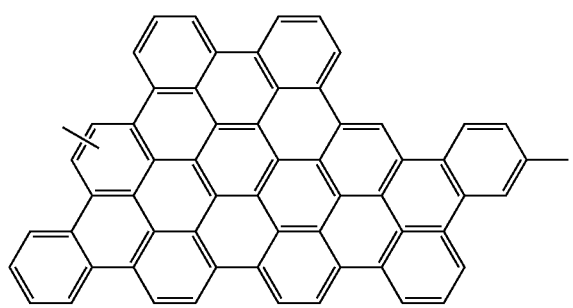

(3)

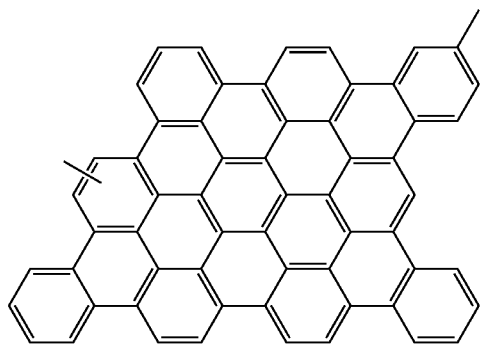

(4)

As described above, the photoelectric conversion material of the embodiment is the polymer having at least one structural unit selected from the nanographenes represented by the general formulae (1) to (4). The polymer may contain only one type of the nanographene represented by one of the general formulae (1) to (4), and the nanographene units may be bonded to each other, but the polymer is not limited thereto. For example, the polymer may be such that the nanographenes represented by the general formulae (1) to (4) are randomly bonded.

The polymerization degree of the polymer is preferably 10 to 150. When the polymerization degree (i.e. the number of the nanographene units bonded to each other) is less than 10, the polymer tends to have a low absorbance coefficient. On the other hand, when the polymerization degree is more than 150, it takes a long time to perform the polymerization for producing the photoelectric conversion material, resulting in a low production efficiency.

In other words, when the polymerization degree is within the above range, the photoelectric conversion material can be efficiently produced with a sufficiently improved absorbance coefficient.

The nanographenes represented by the general formulae (1) to (4) have a molecular weight of 743. Thus, when the polymer has a polymerization degree of 10 to 150, the polymer has a molecular weight of 7,400 to 111,500.

In the BHJ solar cell 10 (see FIG. 1), the back electrode 18 is stacked on the photoelectric conversion layer 16 containing the photoelectric conversion material of the polymer. The back electrode 18 acts as a negative electrode, to which electrons 40 are transferred.

The BHJ solar cell 10 of the embodiment has the above-described basic structure. Operations and advantageous effects of the BHJ solar cell 10 will be described below.

When a light (such as sunlight) is injected to the transparent electrode 12 of the BHJ solar cell 10, the light is transferred through the hole transport layer 14 to the photoelectric conversion layer 16. Then, excitons 42 are generated in the photoelectric conversion layer 16.

The generated excitons 42 are moved in the donor domain 26, and reach the interface between the donor domain 26 and the acceptor domain 28. The excitons 42 are divided into the electrons 40 and the holes 24 on the interface. As described above, the electrons 40 are moved in the acceptor domain 28, and reach the back electrode 18 used as the negative electrode. On the other hand, the holes 24 are moved in the donor domain 26, are transferred through the hole transport layer 14, and reach the transparent electrode 12 used as the positive electrode.

In this embodiment, the donor domain 26 in the photoelectric conversion layer 16 contains the polymer having at least one structural unit selected from the nanographenes represented by the general formulae (1) to (4).

As is clear from the general formulae (1) to (4), the π-electron cloud spreads over the entire nanographene. Thus, the polymer used in the donor domain 26 is a π-conjugated polymer. Naturally the π-electron cloud spreads over a wider area in the polymer than in the single nanographene unit (monomer).

The polymer, which has such a sufficiently spread π-electron cloud, exhibits a maximum absorption wavelength shifted to the long-wavelength side and has a high absorbance coefficient. Thus, the polymer exhibits a narrow bandgap (Eg) corresponding to a small energy level difference between the HOMO and LUMO. Consequently, the excitons 42 are actively generated in the donor domain 26, resulting in a high sunlight utilization efficiency.

In this case, the donor polymer has a LUMO energy level of about −3.9 eV, which is deeper than that of P3HT (about −2.5 eV). Thus, the LUMO energy level of the polymer is closer to that of PCBM (the fullerene derivative) in the acceptor domain 28.

This is likely because the nanographene structural unit in the polymer is a condensed aromatic ring having an aromatic hydrocarbon skeleton, which is similar to the structure of PCBM. Consequently, the BHJ solar cell 10 exhibits a high open circuit voltage Voc.

The BHJ solar cell 10 exhibits an excellent photoelectric power conversion efficiency because of the above properties. Therefore, only a smaller area of the BHJ solar cell 10 is required for achieving a desired power generation capacity. Consequently, the BHJ solar cell 10 can have a light weight and a small load on its installation site, so that the layout of the BHJ solar cell 10 can be designed more freely.

A photoelectric conversion material production method according to this embodiment will be described below in relation to the production of the polymer.

As described above, the polymer can be obtained as the reaction product derived from the polyphenylene.

For example, the polyphenylene can be prepared by reacting a biscyclopentadienone with a diacetylene as shown in the following reaction formula (6).

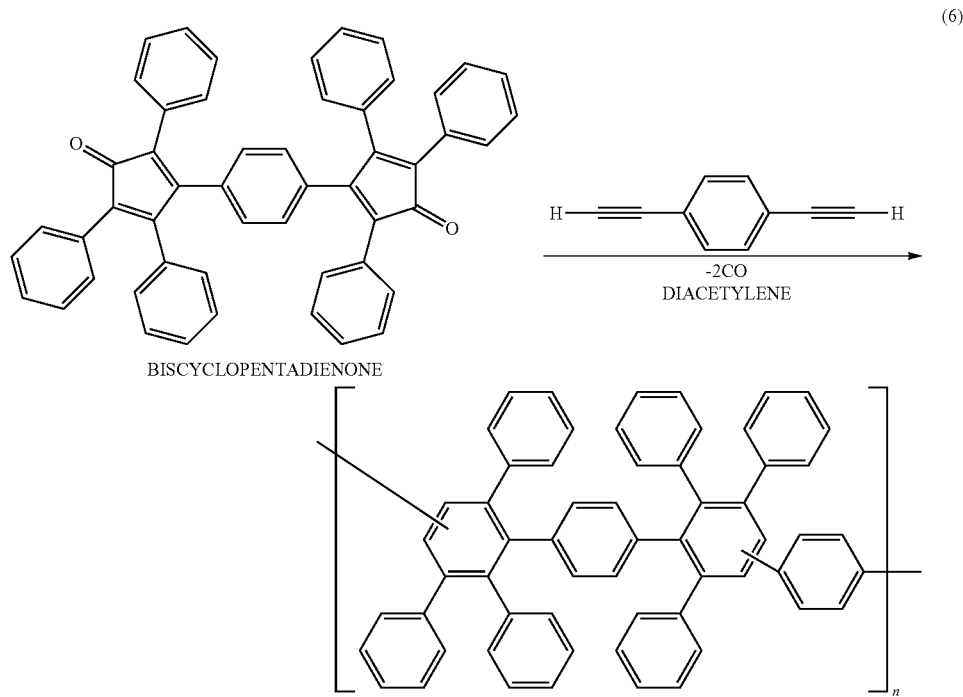

The biscyclopentadienone can be produced by a known method. For example, 1,4-bisbenzil and dibenzyl ketone (1,3-diphenyl-2-propanone) are mixed with n-butanol to prepare a mixture solution, and a methanol solution of Triton B (benzyltrimethylammonium hydroxide) is added to the solution under heating.

Then, the polyphenylene is subjected to a reaction using a catalyst of iron chloride ($FeCl_3$). In the case of using the polyphenylene having one of the structures U2 to U4, the polymer having the nanographene structural unit of the condensed aromatic ring represented by one of the general formulae (1) to (4) is produced as shown in the following reaction formulae (7) to (10).

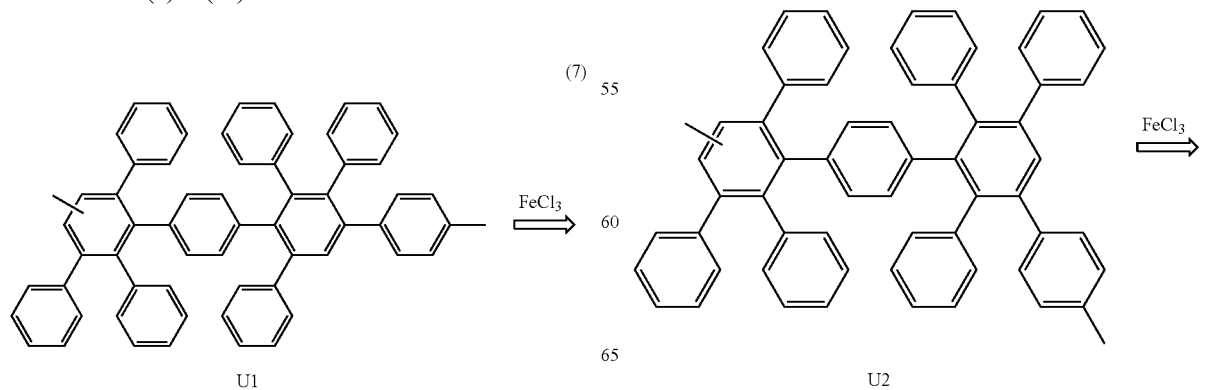

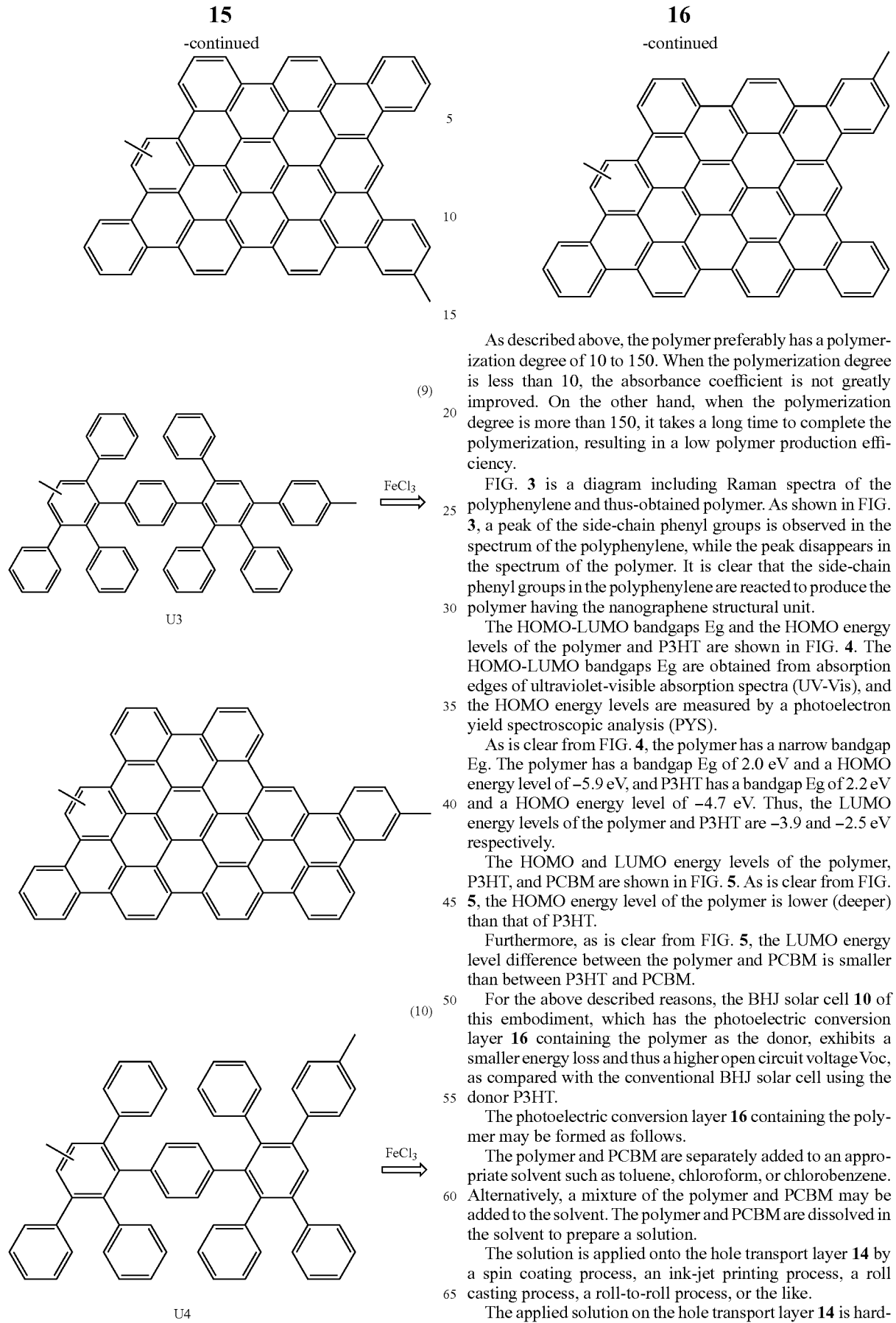

As described above, the polymer preferably has a polymerization degree of 10 to 150. When the polymerization degree is less than 10, the absorbance coefficient is not greatly improved. On the other hand, when the polymerization degree is more than 150, it takes a long time to complete the polymerization, resulting in a low polymer production efficiency.

Figure 3:
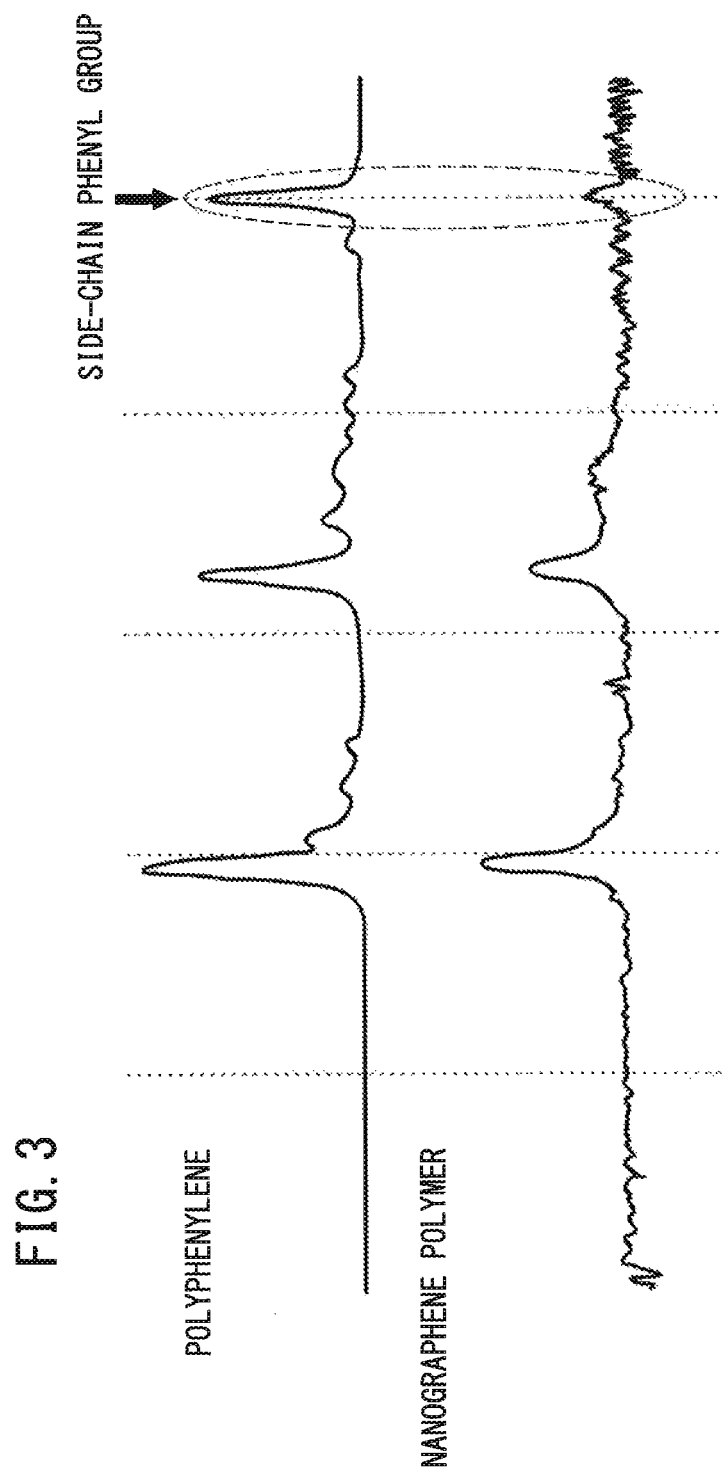
FIG. 3 is a diagram including Raman spectra of the polyphenylene and a photoelectric conversion material (a nanographene polymer derived from the polyphenylene) according to the embodiment.

FIG. 3 is a diagram including Raman spectra of the polyphenylene and thus-obtained polymer. As shown in FIG. 3, a peak of the side-chain phenyl groups is observed in the spectrum of the polyphenylene, while the peak disappears in the spectrum of the polymer. It is clear that the side-chain phenyl groups in the polyphenylene are reacted to produce the polymer having the nanographene structural unit.

The HOMO-LUMO bandgaps Eg and the HOMO energy levels of the polymer and P3HT are shown in FIG. 4. The HOMO-LUMO bandgaps Eg are obtained from absorption edges of ultraviolet-visible absorption spectra (UV-Vis), and the HOMO energy levels are measured by a photoelectron yield spectroscopic analysis (PYS).

As is clear from FIG. 4, the polymer has a narrow bandgap Eg. The polymer has a bandgap Eg of 2.0 eV and a HOMO energy level of −5.9 eV, and P3HT has a bandgap Eg of 2.2 eV and a HOMO energy level of −4.7 eV. Thus, the LUMO energy levels of the polymer and P3HT are −3.9 and −2.5 eV respectively.

Figure 5:
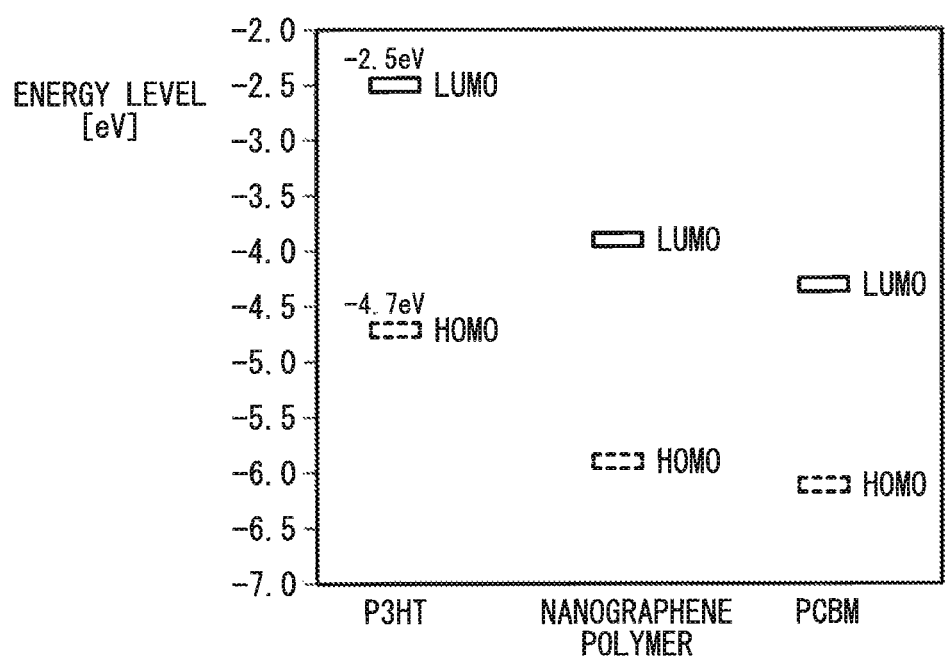
FIG. 5 is an energy level diagram including the HOMO and LUMO energy levels of the photoelectric conversion material (nanographene polymer), P3HT, and PCBM.
Figure 6:
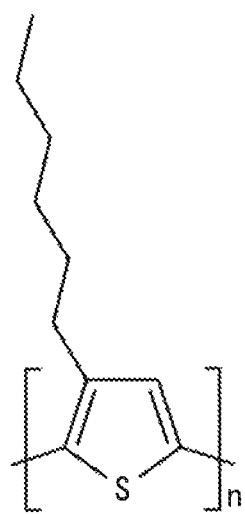
FIG. 6 is a structural formula of P3HT.
Figure 7:
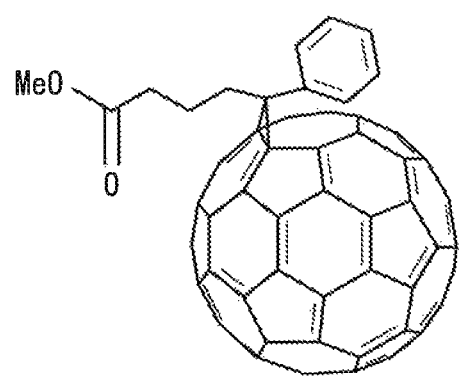
FIG. 7 is a structural formula of PCBM.
Figure 8:
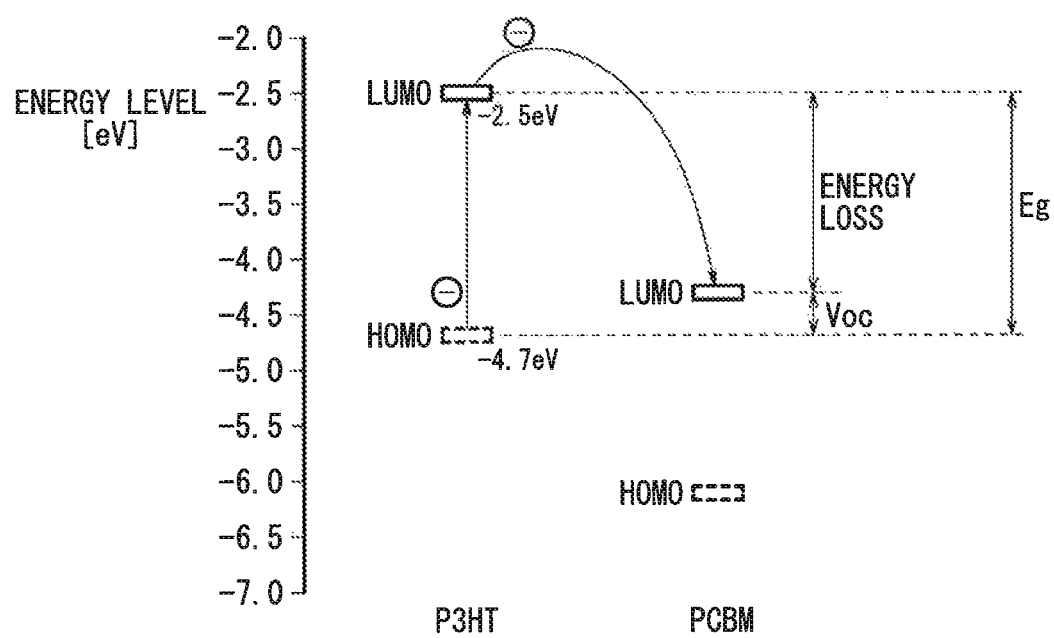
FIG. 8 is a schematic explanatory view of electron transition from the HOMO of P3HT through the LUMO of P3HT to the LUMO of PCBM.

The HOMO and LUMO energy levels of the polymer, P3HT, and PCBM are shown in FIG. 5. As is clear from FIG. 5, the HOMO energy level of the polymer is lower (deeper) than that of P3HT.

Furthermore, as is clear from FIG. 5, the LUMO energy level difference between the polymer and PCBM is smaller than between P3HT and PCBM.

For the above described reasons, the BHJ solar cell 10 of this embodiment, which has the photoelectric conversion layer 16 containing the polymer as the donor, exhibits a smaller energy loss and thus a higher open circuit voltage Voc, as compared with the conventional BHJ solar cell using the donor P3HT.

The photoelectric conversion layer 16 containing the polymer may be formed as follows.

The polymer and PCBM are separately added to an appropriate solvent such as toluene, chloroform, or chlorobenzene. Alternatively, a mixture of the polymer and PCBM may be added to the solvent. The polymer and PCBM are dissolved in the solvent to prepare a solution.

The solution is applied onto the hole transport layer 14 by a spin coating process, an ink-jet printing process, a roll casting process, a roll-to-roll process, or the like.

The applied solution on the hole transport layer 14 is hardened under heating, whereby the photoelectric conversion layer 16 is formed. The photoelectric conversion layer 16 may be subjected to an annealing treatment if necessary. In the annealing treatment, the phase separation between the donor domain 26 and the acceptor domain 28 can be further improved, and the joint interface area between the donor domain 26 and the acceptor domain 28 can be increased to improve the function.

In a case where a monomer is used as the donor, it is difficult to use the above process for forming the photoelectric conversion layer 16 because of the low solubility of the monomer in the solvent. In contrast, in this embodiment, the polymer is used as the donor as described above. Since the polymer is soluble in the solvent, the photoelectric conversion layer 16 containing the polymer can be simply formed with ease at low cost by the above process.

It is to be understood that the present invention is not limited to the above embodiment, and various changes and modifications may be made therein without departing from the scope of the invention.

For example, the above embodiment is described with relation to the bulk heterojunction-type organic photovoltaic cells (BHJ solar cell) 10 having the photoelectric conversion layer 16 containing the mixture of the donor and the acceptor. The present invention is not particularly limited thereto, and the polymer may be used in a planar heterojunction-type organic photovoltaic cell having a donor layer and an acceptor layer separated from each other. In this case, the polymer may be contained in the donor layer.

In the above embodiment, the polymer (photoelectric conversion material) is used as the donor in the organic photovoltaic cells. The present invention is not particularly limited thereto, and the polymer may be used as the acceptor in the organic photovoltaic cells.

Furthermore, the use of the polymer (photoelectric conversion material) is not limited to the photoelectric conversion layer 16 in the organic photovoltaic cells. For example, the polymer may be used in an optical sensor.

What is claimed is:

1. A photoelectric conversion material that acts as an electron donor for donating an electron or an electron acceptor for accepting an electron, comprising
   a polymer having at least one structural unit selected from graphenes represented by the following general formulae (1) to (4):

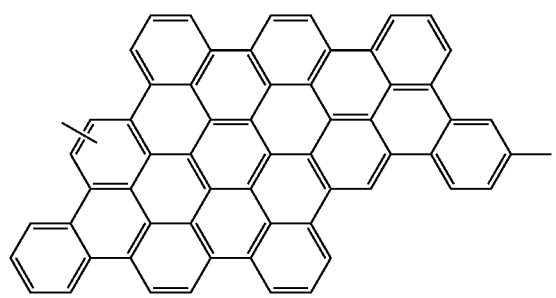

(1)

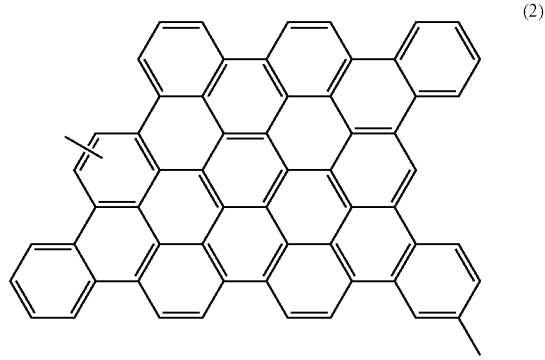

(2)

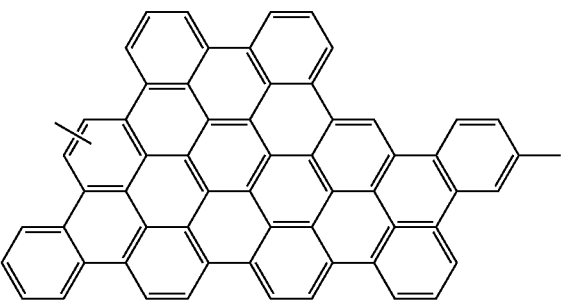

(3)

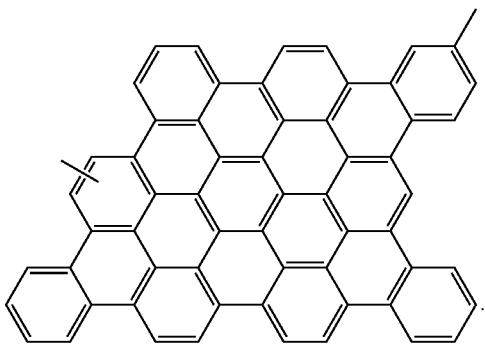

(4)

2. The photoelectric conversion material according to claim 1, wherein the polymer is a reaction product derived from a polyphenylene represented by the following general formula (5):

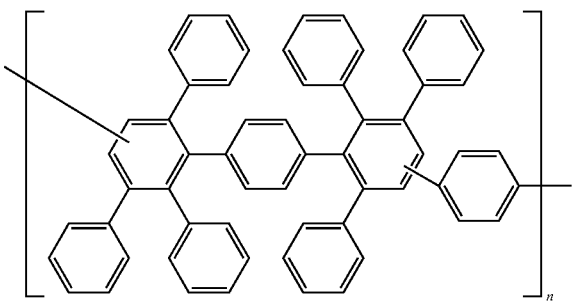

(5)

3. The photoelectric conversion material according to claim 1, wherein the polymer has a polymerization degree of 10 to 150.

4. The photoelectric conversion material according to claim 3, wherein the polymer has a molecular weight of 7,400 to 111,500.

5. A method for producing a photoelectric conversion material that acts as an electron donor for donating an electron or an electron acceptor for accepting an electron, comprising polymerizing a phenylene derivative to prepare a polyphenylene represented by the following general formula (5):

(5)
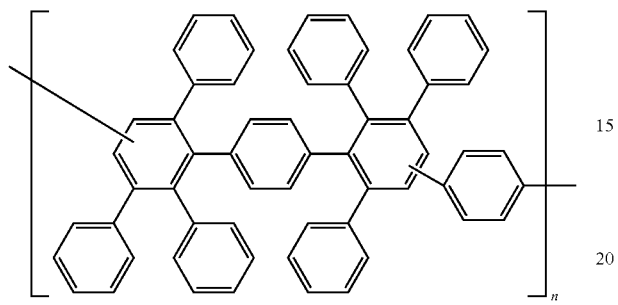

and reacting the polyphenylene to prepare a polymer having at least one structural unit selected from graphenes represented by the following general formulae (1) to (4):

(1)
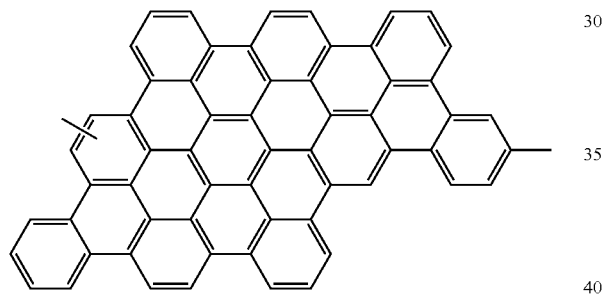

(2)
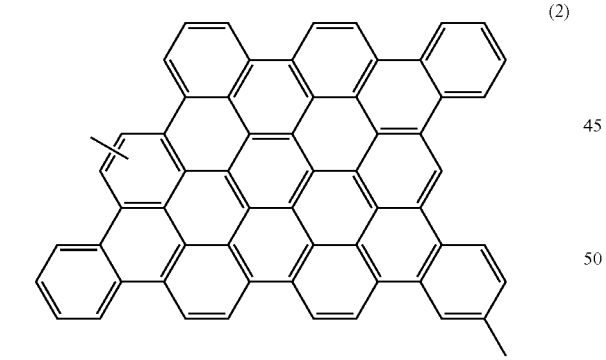

(3)
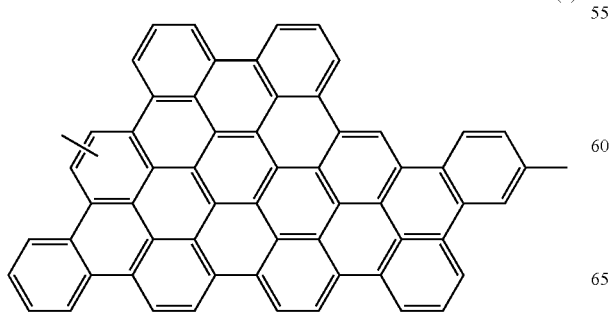

(4)
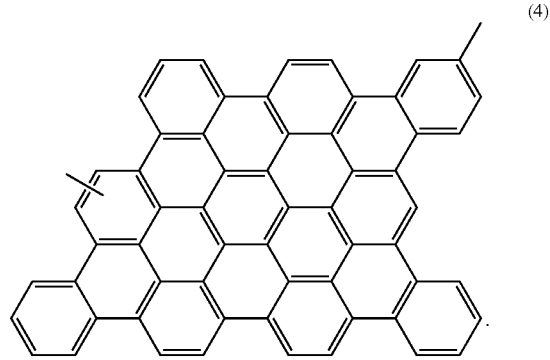

6. The method according to claim 5, wherein the polymer has a polymerization degree of 10 to 150.

7. The method according to claim 6, wherein the polymer has a molecular weight of 7,400 to 111,500.

8. An organic photovoltaic cell comprising a photoelectric conversion material that acts as an electron donor for donating an electron or an electron acceptor for accepting an electron, wherein the organic photovoltaic cell has a photoelectric conversion layer, and the photoelectric conversion layer contains, as an electron donor, a photoelectric conversion material containing a polymer having at least one structural unit selected from graphenes represented by the following general formulae (1) to (4):

(1)
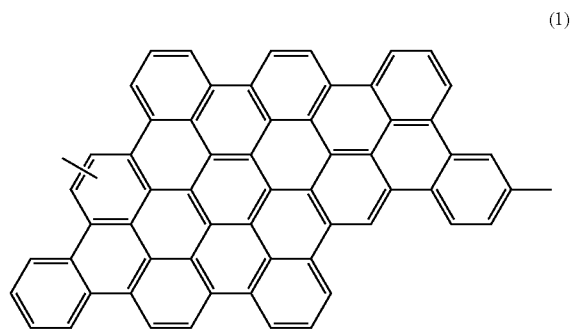

(2)
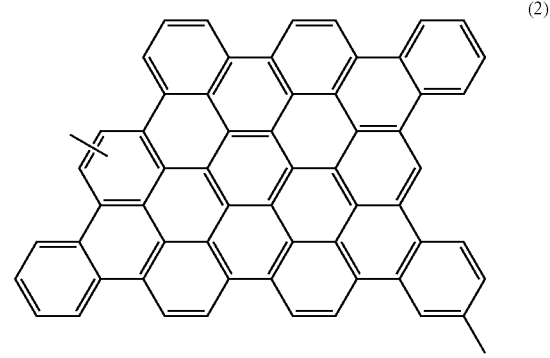

(3)

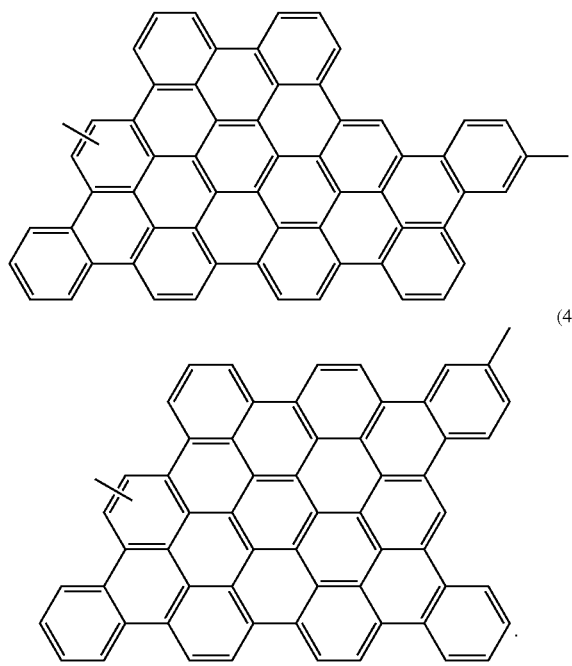

(4)

(5)

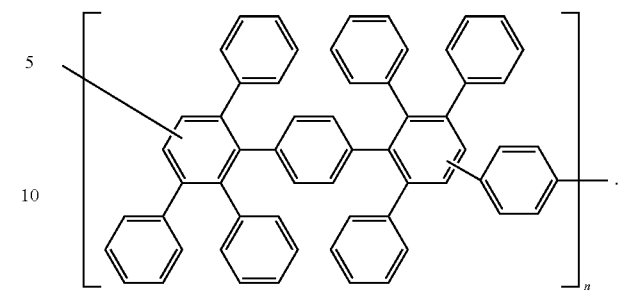

9. The organic photovoltaic cell according to claim 8, wherein the polymer is a reaction product derived from a polyphenylene represented by the following general formula (5):

10. The organic photovoltaic cell according to claim 8, wherein the polymer has a polymerization degree of 10 to 150.

11. The organic photovoltaic cell according to claim 10, wherein the polymer has a molecular weight of 7,400 to 111,500.

12. The organic photovoltaic cell according to claim 8, having a bulk heterojunction structure containing the photoelectric conversion layer,
wherein
the photoelectric conversion layer contains a mixture of the electron donor and an electron acceptor for accepting an electron released from the electron donor.

* * * * *